US009285410B2

(12) United States Patent
Inoguchi et al.

(10) Patent No.: US 9,285,410 B2
(45) Date of Patent: Mar. 15, 2016

(54) CONTROL CIRCUIT, AND POWER GENERATION DEVICE HAVING THE SAME

(71) Applicant: SHINDENGEN ELECTRIC MANUFACTURING CO., LTD., Tokyo (JP)

(72) Inventors: Yuta Inoguchi, Saitama (JP); Takeaki Sugimoto, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 76 days.

(21) Appl. No.: 14/369,693

(22) PCT Filed: Dec. 25, 2012

(86) PCT No.: PCT/JP2012/083506
§ 371 (c)(1),
(2) Date: Jun. 28, 2014

(87) PCT Pub. No.: WO2013/145484
PCT Pub. Date: Oct. 3, 2013

(65) Prior Publication Data
US 2014/0368187 A1 Dec. 18, 2014

(30) Foreign Application Priority Data
Mar. 30, 2012 (JP) ................. 2012-079585

(51) Int. Cl.
G01R 19/00 (2006.01)
G01R 29/18 (2006.01)
(Continued)

(52) U.S. Cl.
CPC ............. G01R 29/18 (2013.01); H02P 9/009 (2013.01); H02P 23/14 (2013.01)

(58) Field of Classification Search
USPC ............ 324/108, 76.11, 76.16, 76.39, 76.48, 324/76.77, 107
See application file for complete search history.

(56) References Cited

U.S. PATENT DOCUMENTS 8,027,180 B2 * 9/2011 Nakagawa ............... H02P 9/48
363/132
8,421,420 B2 * 4/2013 Arai ...................... H02J 7/1492
307/116
(Continued)

FOREIGN PATENT DOCUMENTS

EP 2362535 A1 8/2011
JP S58-7569 A 1/1983
(Continued)

OTHER PUBLICATIONS

PCT Written Opinion of the International Searching Authority for PCT/JP2012/083506, Mar. 19, 2013.
(Continued)

Primary Examiner — Jermele M Hollington
Assistant Examiner — Giovanni Astacio-Oquendo

(57) ABSTRACT

A control circuit 1 for determining a phase sequence of a power generator includes a frequency control unit, a cycle obtaining unit, a determination unit, and an output-supply control unit. The frequency control unit controls a frequency of a sensor signal synchronous with an operation of the power generator, and the cycle obtaining unit obtains a cycle of the sensor signal whose frequency is controlled by the frequency control unit. The determination unit determines the phase sequence of the power generator by detecting timing at which an output voltage outputted from each of the phases of the power generator has risen using the cycle of the sensor signal obtained by the cycle obtaining unit. The output-supply control unit controls a drive circuit according to the phase sequence of the power generator determined by the determination unit.

8 Claims, 9 Drawing Sheets

(51) Int. Cl.
*H02P 9/00* (2006.01)
*H02P 23/14* (2006.01)

(56) References Cited

U.S. PATENT DOCUMENTS

2007/0063664 A1* 3/2007 Rhodes .................. G01R 29/18
 318/400.21
2014/0062457 A1* 3/2014 Zheng .................... G01R 29/18
 324/86

FOREIGN PATENT DOCUMENTS

| | | |
|---|---|---|
| JP | 2002-27757 A | 1/2002 |
| JP | 2007-221850 A | 8/2007 |
| JP | 2008-61322 A | 3/2008 |
| JP | 2010-74973 A | 4/2010 |
| WO | 2010/073593 A1 | 7/2010 |

OTHER PUBLICATIONS

International Search Report for PCT/JP2012/083506, Mar. 19, 2013.

* cited by examiner

CONTROL CIRCUIT, AND POWER GENERATION DEVICE HAVING THE SAME

TECHNICAL FIELD

The present invention relates to a control circuit for determining a phase sequence of a polyphase alternating current generator, and a power generation device having this control circuit.

BACKGROUND ART

Conventionally, in order to generate electric power to be supplied to a load, a polyphase alternating current generator is often used (see PTL 1, for example).

CITATION LIST

Patent Literature

PTL 1: Japanese Unexamined Patent Application Publication No. 2010-74973

SUMMARY OF THE INVENTION

Technical Problem

Phases of a polyphase alternating current generator output electric power having phases different from each other, respectively. Accordingly, it is necessary to specify an order of the phases supplying an output to a load, out of the phases of the polyphase alternating current generator.

In view of the above problem, an object of the present invention is to provide determination of a phase sequence of the polyphase alternating current generator.

Solution to Problem

In order to solve the above problem, the present invention proposes the following.

(1) The present invention proposes a control circuit (e.g., corresponding to a control circuit 1 in FIG. 1) for determining a phase sequence of an n-phase alternating-current generator (having n phases and where n is an integer satisfying n≥2) (e.g., corresponding to a power generator 5 in FIG. 1), the control circuit including: a determination unit (e.g., corresponding to a determination unit 13 in FIG. 1) configured to determine the phase sequence of the n-phase alternating-current generator by detecting timing at which an output voltage outputted from each of the n phases either exceeds or falls below a predetermined threshold value.

According to this aspect of the invention, the control circuit for determining the phase sequence of the n-phase alternating-current generator is provided with the determination unit. In addition, the determination unit determines the phase sequence of the n-phase alternating-current generator by detecting timing at which the voltage outputted from each of the n phases either exceeds or falls below the predetermined threshold value. Thus, it is possible to determine the phase sequence of the n-phase alternating-current generator.

(2) The present invention proposes the control circuit of (1) further including: a cycle obtaining unit (e.g., corresponding to a cycle obtaining unit 12 in FIG. 1) configured to obtain a cycle (e.g., corresponding to a sensor cycle T in FIG. 7) of the n-phase alternating-current generator, wherein, assuming that time resulting from division of the cycle obtained by the cycle obtaining unit by the n is specific time (e.g., corresponding to 1/3T in FIG. 7), the determination unit performs a phase determination procedure for obtaining one phase, out of the n phases, in which the output voltage has become no lower than the predetermined threshold voltage during a period from a time point that is x times of the specific time before predetermined reference timing (where x is an integer satisfying 0≤x≤n−1) to a time point that is (x+1) times of the specific time before the reference timing.

According to this aspect of the invention, the control circuit of (1) is further provided with the cycle obtaining unit for obtaining the cycle of the n-phase alternating-current generator. In addition, the determination unit performs the phase sequence determination procedure assuming that the time resulting from division of the cycle obtained by the cycle obtaining unit by the n is the specific time. In the phase sequence determination procedure, out of the n phases, the one phase is obtained in which the output voltage has become no lower than the predetermined threshold voltage during the period from the time point that is x times of the specific time before the predetermined reference timing to the time point that is (x+1) times of the specific time before the reference timing.

Accordingly, it is possible to obtain the phase in which the output voltage has become no lower than the threshold voltage one by one every time the phase sequence determination procedure is performed. Therefore, the phase sequence determination procedure performed as needed allows determination of the phase sequence for various types of n-phase alternating-current generators, and thus it is possible to achieve a versatile control circuit.

(3) The present invention proposes the control circuit of (1) further including: a cycle obtaining unit (e.g., corresponding to the cycle obtaining unit 12 in FIG. 1) configured to obtain a cycle (e.g., corresponding to the sensor cycle T in FIG. 7) of the n-phase alternating-current generator, wherein, assuming that time resulting from division of the cycle obtained by the cycle obtaining unit by the n is specific time (e.g., corresponding to 1/3T in FIG. 7), the determination unit performs a phase determination procedure for obtaining one phase, out of the n phases, in which the output voltage has become no higher than the predetermined threshold voltage during a period from a time point that is x times of the specific time before predetermined reference timing (where x is an integer satisfying 0≤x≤n−1) to a time point that is (x+1) times of the specific time before the reference timing.

According to this aspect of the invention, the control circuit of (1) is further provided with the cycle obtaining unit for obtaining the cycle of the n-phase alternating-current generator. In addition, the determination unit performs the phase sequence determination procedure assuming that the time resulting from division of the cycle obtained by the cycle obtaining unit by the n is the specific time. In the phase sequence determination procedure, out of the n phases, the one phase is obtained in which the output voltage has become no higher than the predetermined threshold voltage during the period from the time point that is x times of the specific time before the predetermined reference timing to the time point that is (x+1) times of the specific time before the reference timing.

Accordingly, it is possible to obtain the phase in which the output voltage has become no higher than the threshold voltage one by one every time the phase sequence determination procedure is performed. Therefore, the phase sequence determination procedure performed as needed allows determination of the phase sequence for various types of n-phase alternating-current generators, and thus it is possible to achieve a versatile control circuit.

(4) The present invention proposes the control circuit of (2) or (3) configured such that the determination unit performs the phase determination procedure by substituting i+n for the x when failing to obtain the one phase through the phase determination procedure by substituting i for the x (where i is an integer satisfying 0≤i≤n).

In this case, for example, if the cycle of the n-phase alternating-current generator changes suddenly due to a change in the operation of the n-phase alternating-current generator, or if an measurement error occurs in the output voltage of each phase of the n-phase alternating-current generator, the timing at which the output voltage has become no lower than the threshold voltage, or the timing at which the output voltage has become no higher than the threshold voltage may change with respect to the reference timing. If such a change occurs, there is possibly a case in which there is no phase in which the output voltage has become either no lower or no higher than the threshold voltage during the period from the time point that is x times of the specific time before predetermined reference timing to the time point that is (x+1) times of the specific time before the reference timing.

Thus, according to the present invention, even when the control circuit of (2) is not able to obtain the one phase in which the output voltage has become no lower than the threshold voltage, or the control circuit of (3) is not able to obtain the one phase in which the output voltage has become no higher than the threshold voltage, through the phase determination procedure by substituting i for the x, the control circuit performs the phase determination procedure by substituting i+n for the x. Accordingly, when the one phase has not been obtained by the phase determination procedure, the phase determination procedure is performed using the output voltage of each phase in a previous cycle. Therefore, even if the cycle of the n-phase alternating-current generator changes suddenly due to a change in the operation of the n-phase alternating-current generator, or even if a measurement error occurs in the output voltage of each phase of the n-phase alternating-current generator, it is possible to determine the phase sequence of the n-phase alternating-current generator.

(5) The present invention proposes the control circuit of (1) further including: a cycle obtaining unit (e.g., corresponding to the cycle obtaining unit 12 in FIG. 1) configured to obtain a cycle (e.g., corresponding to the sensor cycle T in FIG. 7) of the n-phase alternating-current generator, wherein assuming that time resulting from division of the cycle obtained by the 2n is specific time, the determination unit performs a phase determination procedure for obtaining, out of the n phases, one phase in which the output voltage has become no lower than the predetermined threshold voltage and one phase in which the output voltage has become no higher than the threshold voltage one by one during a period from a time point that is x times of the specific time before predetermined reference timing (where x is an integer satisfying 0≤x≤2n−1) to a time point that is (x+1) times of the specific time before the reference timing.

According to this aspect of the invention, the control circuit of (1) is further provided with the cycle obtaining unit for obtaining the cycle of the n-phase alternating-current generator. In addition, the determination unit performs the phase sequence determination procedure assuming that the time resulting from division of the cycle obtained by the cycle obtaining unit by 2n, which is twofold of the n, is the specific time. In the phase sequence determination procedure, the one phases are obtained one by one out of the n phases, the one phases being the phase in which the output voltage has become no lower than the predetermined threshold voltage and the phase in which the output voltage has become no higher than the threshold voltage during the period from the time point that is x times of the specific time before the predetermined reference timing to the time point that is (x+1) times of the specific time before the reference timing.

Accordingly, it is possible to obtain the phase in which the output voltage has become no lower than the threshold voltage and the phase in which the output voltage has become no higher than the threshold voltage one by one every time the phase sequence determination procedure is performed. Therefore, the phase sequence determination procedure performed as needed allows determination of the phase sequence for various types of n-phase alternating-current generators, and thus it is possible to achieve a versatile control circuit.

(6) The present invention proposes the control circuit of (5) configured such that the determination unit performs the phase determination procedure by substituting i+n for the x when failing to obtain at least one of the one phase in which the output voltage has become no lower than the threshold voltage and the one phase in which the output voltage has become no higher than the threshold voltage through the phase determination procedure by substituting i for the x (where i is an integer satisfying 0≤i≤n).

In this case, for example, if the cycle of the n-phase alternating-current generator changes suddenly due to a change in the operation of the n-phase alternating-current generator, or if an measurement error occurs in the output voltage of each phase of the n-phase alternating-current generator, the timing at which the output voltage has become no lower than the threshold voltage, or the timing at which the output voltage has become no higher than the threshold voltage may change with respect to the reference timing. If such a change occurs, there is possibly a case in which there is no phase in which the output voltage has become either no lower or no higher than the threshold voltage during the period from the time point that is x times of the specific time before predetermined reference timing to the time point that is (x+1) times of the specific time before the reference timing.

Thus, according to the present invention, even when the control circuit of (5) is not able to obtain at least one of the phase in which the output voltage has become no lower than the threshold voltage and the phase in which the output voltage has become no higher than the threshold voltage through the phase determination procedure by substituting i for the x, the control circuit performs the phase determination procedure by substituting i+n for the x. Accordingly, when the one phases have not been obtained one by one by the phase determination procedure, the phase determination procedure is performed using the output voltage of each phase in a previous cycle. Therefore, even if the cycle of the n-phase alternating-current generator changes suddenly due to a change in the operation of the n-phase alternating-current generator, or even if a measurement error occurs in the output voltage of each phase of the n-phase alternating-current generator, it is possible to determine the phase sequence of the n-phase alternating-current generator.

(7) The present invention proposes the control circuit of any of (2) to (6) configured such that the reference timing is timing synchronous with the n-phase alternating-current generator.

According to this aspect of the invention, the control circuit of any of (2) to (6) takes the timing synchronous with the n-phase alternating-current generator as the reference timing. Therefore, it is possible to determine the phase sequence in synchronization with the n-phase alternating-current generator.

(8) The present invention proposes the control circuit of any of (2) to (7) further including: a frequency control unit (e.g., corresponding to a frequency control unit 11 in FIG. 1) configured to have a frequency of a reference signal indicating the reference timing match with a frequency of the output voltage of one of the n phases.

According to this aspect of the invention, the control circuit of any of (2) to (7) is provided with the frequency control unit. In addition, the frequency control unit has the frequency of the reference signal indicating the reference timing match with the frequency of the output voltage of one of the n phases.

With this, the phase determination procedure may be performed at earlier timing as compared to a case in which the frequency of the reference signal is lower than the frequency of the output voltage of one of the n phases. Therefore, it is possible to determine the phase sequence of the n-phase alternating-current generator in a shorter time.

On the other hand, if the frequency of the reference signal is higher than the frequency of the output voltage of one of the n phases, there is possibly a case in which the phase in which the output voltage has become no lower than the threshold voltage or the phase in which the output voltage has become no higher than the threshold voltage may not be obtained depending on a value of the x when the phase sequence determination procedure is performed. However, if the frequency of the reference signal is equal to the frequency of the output voltage of one of the n phases, it is possible to obtain the phase in which the output voltage has become no lower than the threshold voltage or the phase in which the output voltage has become no higher than the threshold voltage regardless of the value of the x when the phase sequence determination procedure is performed.

(9) The present invention proposes a power generation device (e.g., corresponding to a battery charger AA in FIG. 1) including the control circuit as defined in one of (1) to (8), and electric power outputted from the n-phase alternating-current generator is supplied to a load (e.g., corresponding to a battery 6 in FIG. 1).

According to this aspect of the invention, the control circuit of any of (1) to (8) is provided for the power generation device to supply electric power outputted from the n-phase alternating-current generator to the load. Therefore, by supplying electric power outputted from the n-phase alternating-current generator to the load based on the result of determination of the phase sequence of the n-phase alternating-current generator by the control circuit, it is possible to supply electric power from the n-phase alternating-current generator to the load appropriately.

Advantageous Effects of Invention

According to the present invention, it is possible to determine a phase sequence of an n-phase alternating-current generator.

DESCRIPTION OF EMBODIMENT

Hereinafter, embodiments of the present invention will be described with reference to the drawings. It should be noted that components in the embodiments described below may be replaced by existing components and the like as appropriate, or may be configured in various different manners including combinations with other existing components. Therefore, the scope of the invention defined by the appended claims may not be limited to the following embodiments.

First Embodiment

Figure 1:
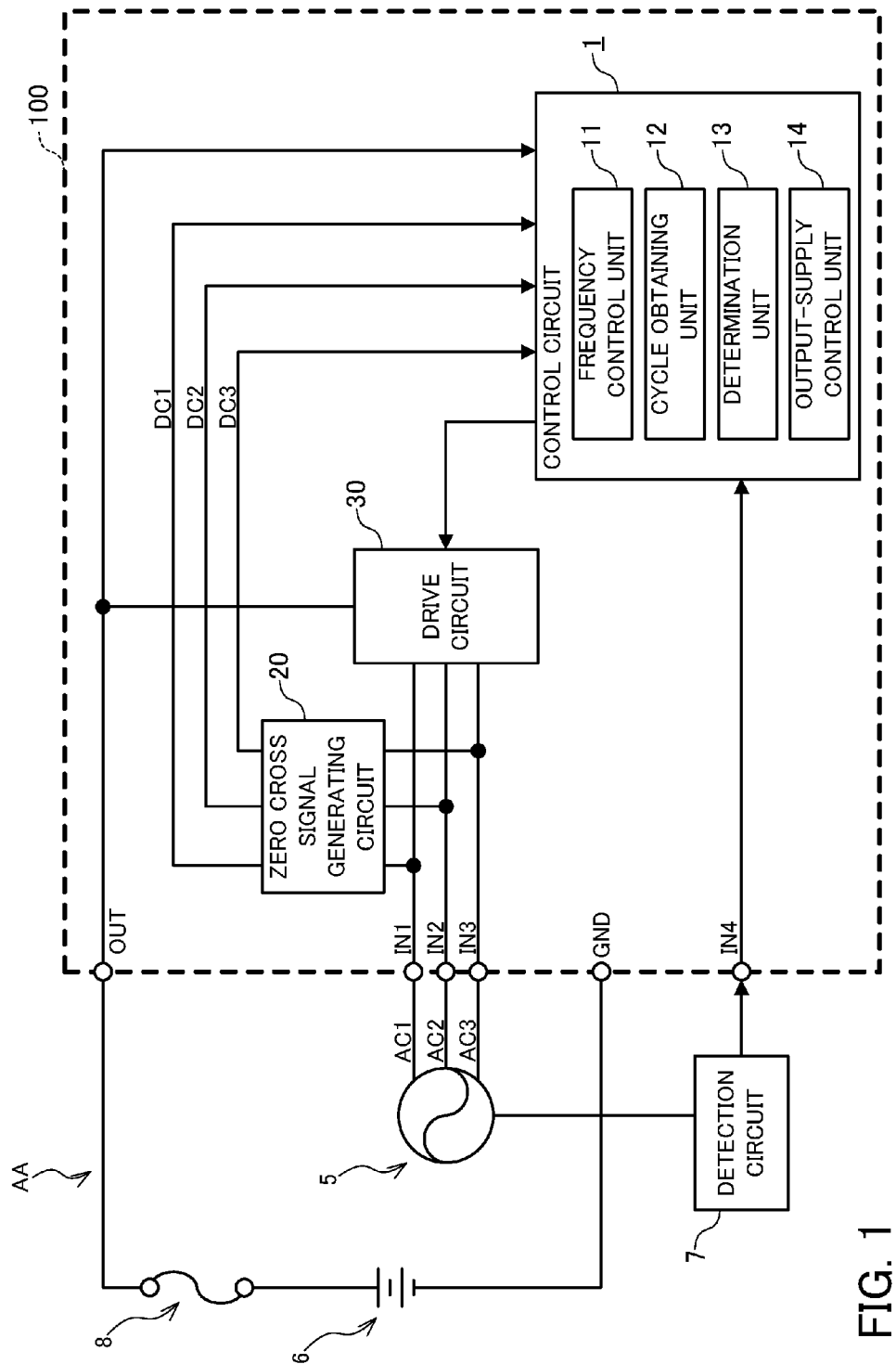
FIG. 1 is a circuit diagram of a battery charger according to a first embodiment of the present invention.

FIG. 1 is a circuit diagram of a battery charger AA according to a first embodiment of the present invention. The battery charger AA includes a power generator 5, a battery 6 that is charged by electric power outputted from the power generator 5, a detection circuit 7 for detecting an operating condition of the power generator 5, a fuse 8, and a power generation control device 100 as a regulator.

The power generator 5 is a three-phase alternating-current generator having three phases AC1, AC2, and AC3. The phases AC1-AC3 are respectively connected to input terminals IN1-IN3 of the power generation control device 100.

The detection circuit 7 detects an operating condition of the power generator 5, and outputs a sensor signal synchronous with an operation of the power generator 5. Specifically, as the sensor signal, the detection circuit 7 outputs a signal indicating information including a cycle, a frequency, and a revolving speed of the power generator 5.

To a positive electrode of the battery 6, an output terminal OUT of the power generation control device 100 is connected via the fuse 8. To a negative electrode the battery 6, a ground terminal GND of the power generation control device 100 connected to a source of reference potential is connected.

The power generation control device 100 includes a control circuit 1, a zero cross signal generating circuit 20, and a drive circuit 30.

The zero cross signal generating circuit 20 is connected to the input terminals IN1-IN3 and the control circuit 1. The zero cross signal generating circuit 20 rectifies output voltages outputted respectively from the phases AC1-AC3 of the power generator 5, and outputs the rectified voltages respectively as signals DC1-DC3. Specifically, the voltage of the signal DC1 is taken as VH when the output voltage outputted from the phase AC1 of the power generator 5 is no lower than a predetermined threshold voltage, and as VL that is lower than VH when the voltage outputted from the phase AC1 is lower than the threshold voltage, and the resulting signal DC1 is outputted. Similarly to the output voltage outputted from the phase AC1, this also applies to the output voltages outputted respectively from the phases AC2 and AC3 of the power generator 5, and the voltages of the signals DC2 and DC3 are changed according to results of comparison with the threshold voltage and then outputted.

The drive circuit 30 is connected to the input terminals IN1-IN3 and the control circuit 1, and includes switching elements Q1, Q2, and Q3 (not depicted). Each of the switching elements Q1-Q3 is provided so as to be paired with each of the phases AC1-AC3 of the power generator 5. The drive circuit 30 controls each of the switching elements Q1-Q3 to be turned on and off according to a control signal outputted from the control circuit 1 to supply electric power outputted from each of the phases AC1-AC3 of the power generator 5 to the battery 6 via the output terminal OUT and the fuse 8.

The control circuit 1 is connected to the input terminal IN4, the output terminal OUT, the zero cross signal generating circuit 20, and the drive circuit 30. The control circuit 1 includes a frequency control unit 11, a cycle obtaining unit 12, a determination unit 13, and an output-supply control unit 14. The control circuit 1 determines a phase sequence of the phases AC1-AC3 of the power generator 5, and performs PWM control of the switching elements Q1-Q3 according to a result of the determination.

The output-supply control unit 14 outputs the control signal to the drive circuit 30 according to the phase sequence of the power generator 5 determined by the determination unit 13 as will be later described, to control the switching elements Q1-Q3.

Figure 2:
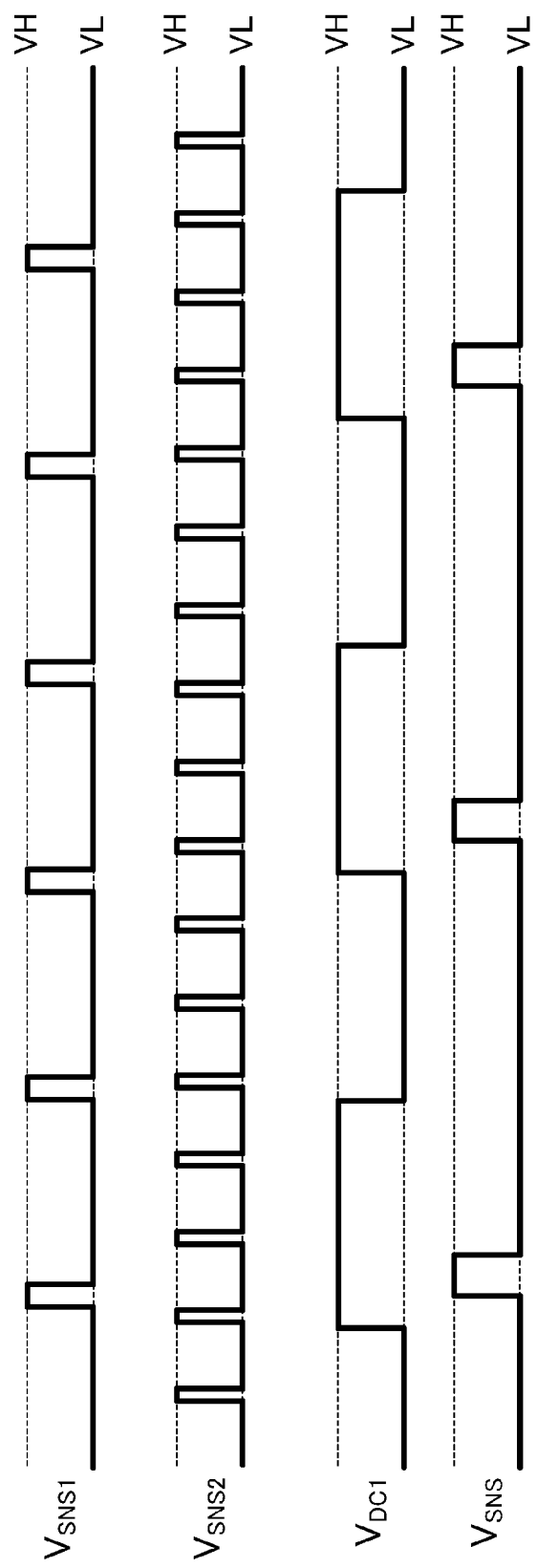
FIG. 2 is a diagram for illustrating an operation of a frequency control unit provided for the battery charger.

As illustrated in FIG. 2, the frequency control unit 11 has a frequency of the sensor signal be equal to a frequency of the signal DC1 by multiplying or dividing the sensor signal. Referring to FIG. 2, each of $V_{SNS1}$ and $V_{SNS2}$ is an example of a voltage of the sensor signal before the frequency is controlled by the frequency control unit 11, that is, the sensor signal outputted from the detection circuit 7. $V_{DC1}$ represents a voltage of the signal DC1, that is, a voltage resulting from rectification of the output voltage outputted from the phase AC1 of the power generator 5. $V_{SNS}$ represents a voltage of the sensor signal whose frequency is controlled by the frequency control unit 11.

The cycle obtaining unit 12 obtains a cycle of the sensor signal whose frequency is controlled by the frequency control unit 11, as a sensor cycle T.

Figure 3:
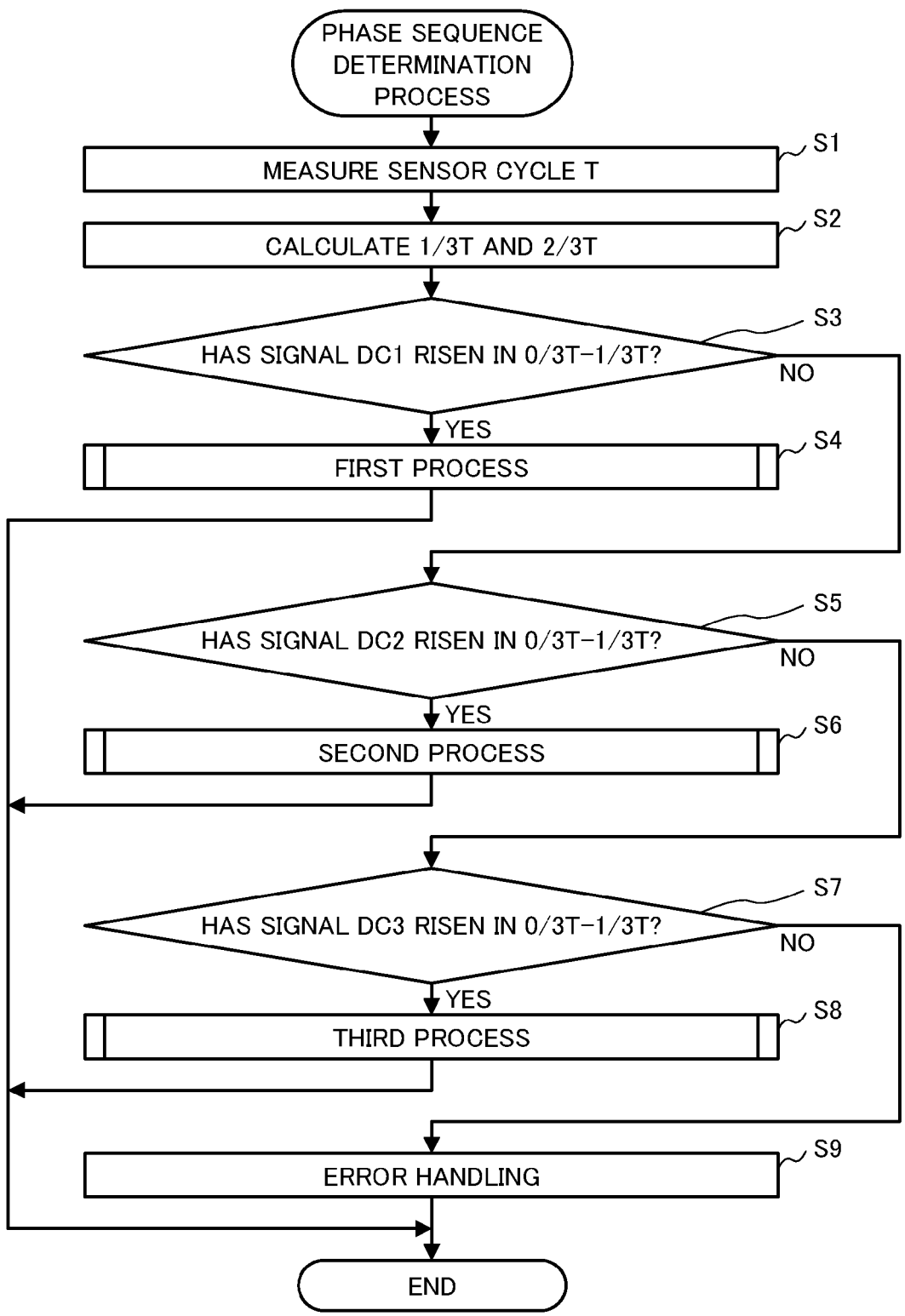
FIG. 3 is a flowchart showing an operation of a determination unit provided for the battery charger.

The determination unit 13 performs a phase sequence determination process shown in FIG. 3 to determine the phase sequence of the phases AC1-AC3 of the power generator 5.

FIG. 3 is a flowchart of the phase sequence determination process performed by the determination unit 13. Here, FIG. 7 is referred as needed in order to describe the phase sequence determination process shown in FIG. 3.

Figure 7:
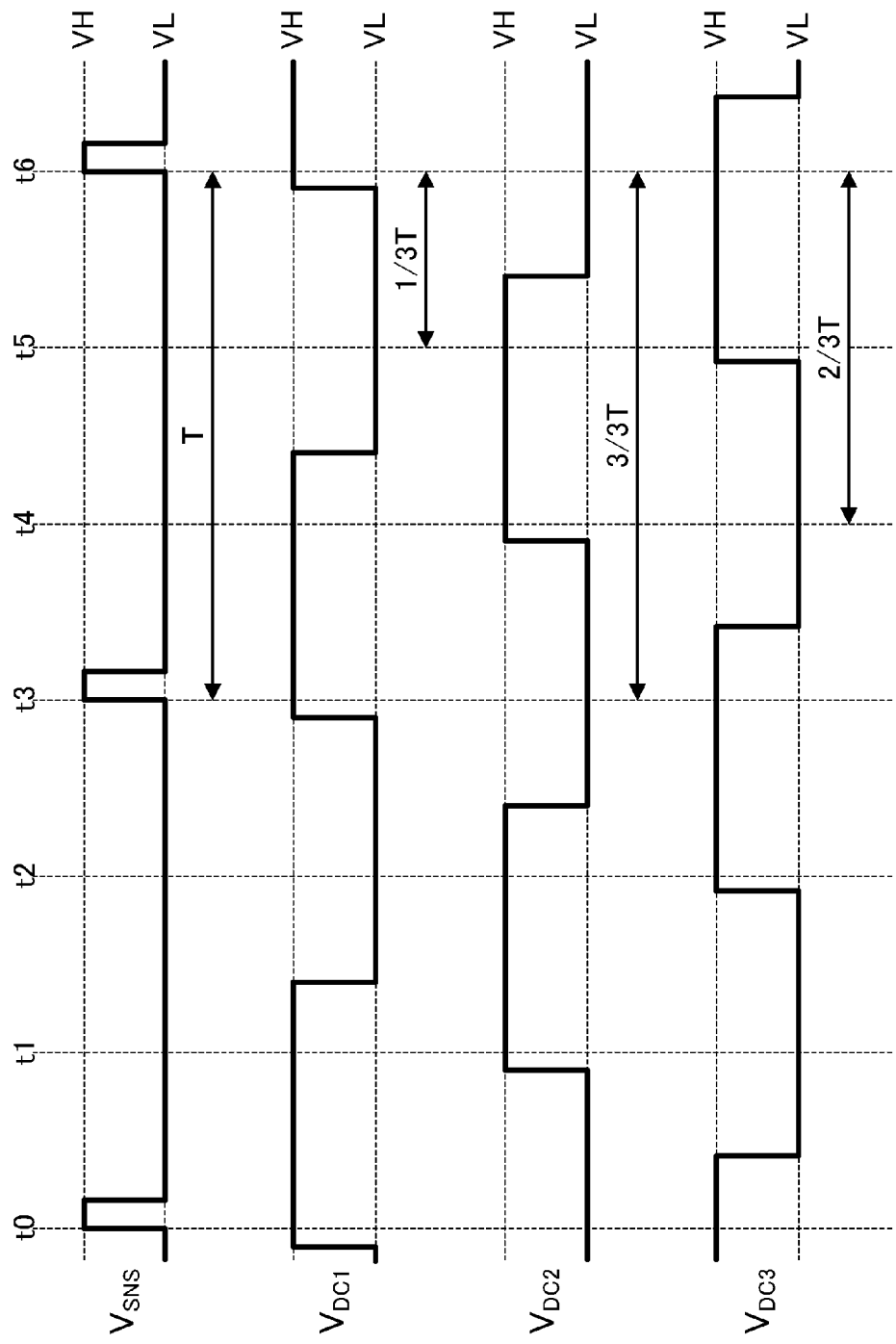
FIG. 7 is a diagram for illustrating the operation of the determination unit.

Referring to FIG. 7, $V_{SNS}$ represents the voltage of the sensor signal whose frequency is controlled by the frequency control unit 11. $V_{DC1}$ represents a voltage of the signal DC1, that is, a voltage resulting from rectification of the output voltage outputted from the phase AC1 of the power generator 5. $V_{DC2}$ represents a voltage of the signal DC2, that is, a voltage resulting from rectification of the output voltage outputted from the phase AC2 of the power generator 5. $V_{DC3}$ represents a voltage of the signal DC3, that is, a voltage resulting from rectification of the output voltage outputted from the phase AC3 of the power generator 5. In FIG. 7, the phase sequence of the power generator 5 is AC1, AC2, and AC3.

Referring back to FIG. 3, in Step S1, the determination unit 13 causes the cycle obtaining unit 12 to measure the sensor cycle T, and the process moves to Step S2.

In Step S2, the determination unit 13 divides the sensor cycle T by "3", which is equal to the number of the phases of the power generator 5, to obtain 1/3T and 2/3T, and the process moves to Step S3.

In Step S3, the determination unit 13 determines whether or not the signal DC1 has risen during a period from a time point 0/3T before to a time point 1/3T before with respect to timing at which the sensor signal whose frequency is controlled by the frequency control unit 11 (hereinafter referred to as a "modulated sensor signal") has risen. Then, the process moves to Step S4 if it is determined to have risen, and to Step S5 if it is not determined to have risen.

It should be noted that in FIG. 7, a time point t6 that is timing at which the modulated sensor signal has risen is taken as the reference. Further, the signal DC1 has risen during a period from the time point t6 which is 0/3t before the time point t6 to a time point t5 which is 1/3T before the time point t6. Namely, during the period between the time points t6 and t5, the output voltage outputted from the phase AC1 of the power generator 5 is no lower than the predetermined threshold voltage. Accordingly, in a state illustrated in FIG. 7, it is determined that the signal has risen in Step S3.

Referring back to FIG. 3, in Step S4, the determination unit 13 performs a first process that will be later described with reference to FIG. 4, and terminates the phase sequence determination process shown in FIG. 3.

In Step S5, the determination unit 13 determines whether or not the signal DC2 has risen during the period from the time point 0/3T before to the time point 1/3T before with respect to the timing at which the modulated sensor signal has risen. Then, the process moves to Step S6 if it is determined to have risen, and to Step S7 if it is not determined to have risen.

In Step S6, the determination unit 13 performs a second process that will be later described with reference to FIG. 5, and terminates the phase sequence determination process shown in FIG. 3.

In Step S7, the determination unit 13 determines whether or not the signal DC3 has risen during the period from the time point 0/3T before to the time point 1/3T before with respect to the timing at which the modulated sensor signal has risen. Then, the process moves to Step S8 if it is determined to have risen, and to Step S9 if it is not determined to have risen.

In Step S8, the determination unit 13 performs a third process that will be later described with reference to FIG. 6, and terminates the phase sequence determination process shown in FIG. 3.

In Step S9, the determination unit 13 performs error handling, and terminates the phase sequence determination process shown in FIG. 3. With the power generator 5 that is the three-phase alternating-current generator, it is supposed that one of the signals DC1-DC3 rises every time 1/3T passes. The fact that the process has moved to Step S9, however, indicates that none of the signals DC1-DC3 has risen during the period from the time point 0/3T before to the time point 1/3T before with respect to the timing at which the modulated sensor signal has risen. Accordingly, the error handling for notifying that it is not possible to perform the phase sequence determine is performed.

Figure 4:
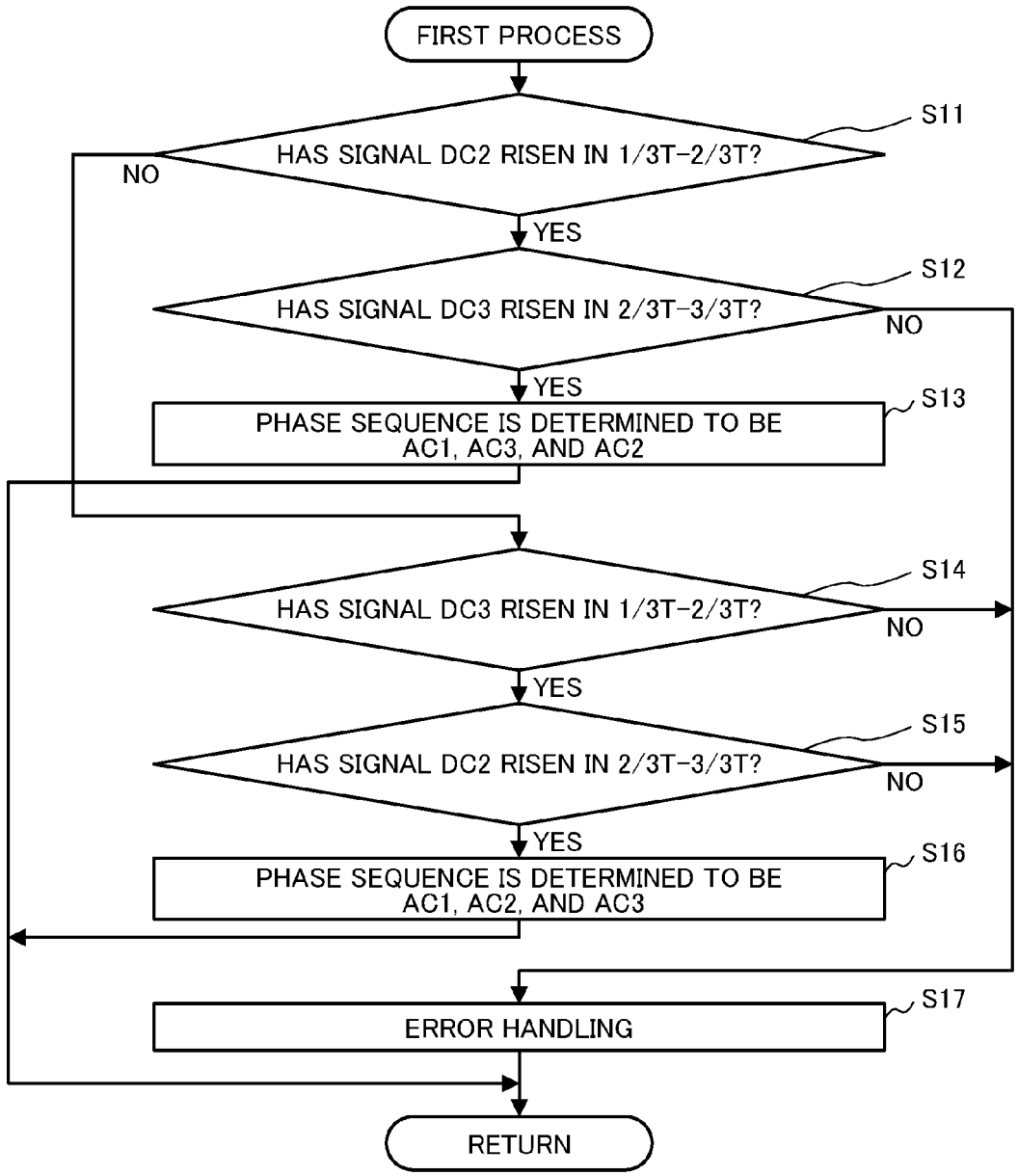
FIG. 4 is a flowchart showing the operation of the determination unit.

FIG. 4 is a flowchart of the first process performed by the determination unit 13.

In Step S11, the determination unit 13 determines whether or not the signal DC2 has risen during a period from a time point 1/3T before to a time point 2/3T before with respect to the timing at which the modulated sensor signal has risen. Then, the process moves to Step S12 if it is determined to have risen, and to Step S14 if it is not determined to have risen.

In Step S12, the determination unit 13 determines whether or not the signal DC3 has risen during a period from a time point 2/3T before to a time point 3/3T before with respect to the timing at which the modulated sensor signal has risen. Then, the process moves to Step S13 if it is determined to have risen, and to Step S17 if it is not determined to have risen.

In Step S13, the determination unit 13 determines that the phase sequence of the power generator 5 is AC1, AC3, and AC2, and terminates the first process shown in FIG. 4.

In Step S14, the determination unit 13 determines whether or not the signal DC3 has risen during the period from the time point 1/3T before to the time point 2/3T before with respect to the timing at which the modulated sensor signal has risen. Then, the process moves to Step S15 if it is determined to have risen, and to Step S17 if it is not determined to have risen.

Here, it should be noted that in FIG. 7, the signal DC3 has risen during a period from the time point t5 which is 1/3T before the time point t6 to a time point t4 which is 2/3T before the time point t6. Namely, during the period between the time points t5 and t4, the output voltage outputted from the phase AC3 of the power generator 5 is no lower than the predetermined threshold voltage. Accordingly, in the state illustrated in FIG. 7, it is determined that the signal has risen in Step S14.

Referring back to FIG. 4, in Step S15, the determination unit 13 determines whether or not the signal DC2 has risen during the period from the time point 2/3T before to the time point 3/3T before with respect to the timing at which the modulated sensor signal has risen. Then, the process moves to Step S16 if it is determined to have risen, and to Step S17 if it is not determined to have risen.

Here, it should be noted that in FIG. 7, the signal DC2 has risen during a period from the time point t4 which is 2/3T before the time point t6 to a time point t3 which is 3/3T before the time point t6. Namely, during the period between the time points t4 and t3, the output voltage outputted from the phase AC2 of the power generator 5 is no lower than the predetermined threshold voltage. Accordingly, in the state illustrated in FIG. 7, it is determined that the signal has risen in Step S15.

Referring back to FIG. 4, in Step S16, the determination unit 13 determines that the phase sequence of the power generator 5 is AC1, AC2, and AC3, and terminates the first process shown in FIG. 4. In the state illustrated in FIG. 7, it is determined that the phase sequence of the power generator 5 is AC1, AC2, and AC3.

Referring back to FIG. 4, in Step S17, similarly to Step S9 described above, the determination unit 13 performs error handling, and terminates the first process shown in FIG. 4.

Figure 5:
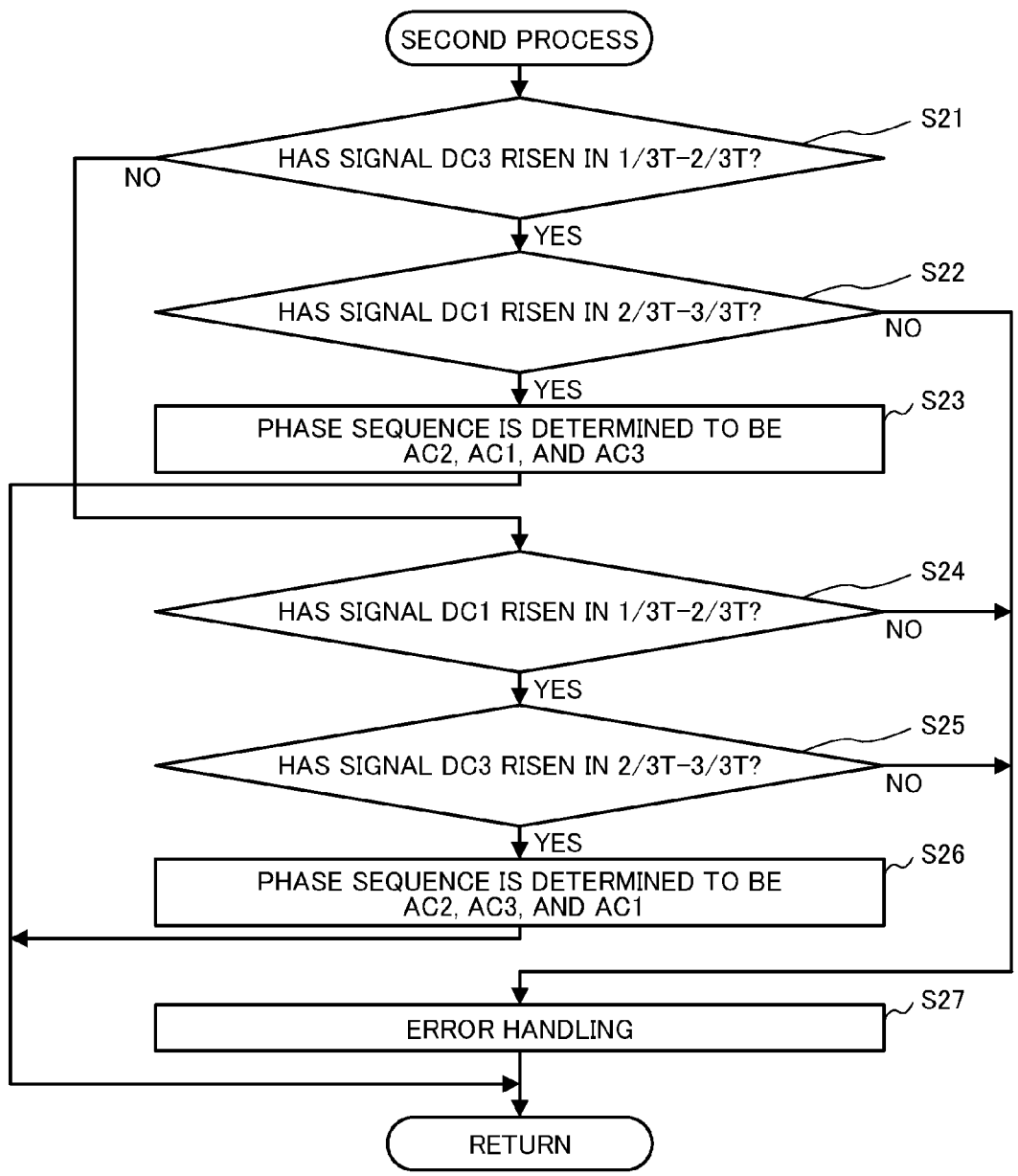
FIG. 5 is a flowchart showing the operation of the determination unit.

FIG. 5 is a flowchart of the second process performed by the determination unit 13.

In Step S21, the determination unit 13 determines whether or not the signal DC3 has risen during the period from the time point 1/3T before to the time point 2/3T before with respect to the timing at which the modulated sensor signal has risen. Then, the process moves to Step S22 if it is determined to have risen, and to Step S24 if it is not determined to have risen.

In Step S22, the determination unit 13 determines whether or not the signal DC1 has risen during the period from the time point 2/3T before to the time point 3/3T before with respect to the timing at which the modulated sensor signal has risen. Then, the process moves to Step S23 if it is determined to have risen, and to Step S27 if it is not determined to have risen.

In Step S23, the determination unit 13 determines that the phase sequence of the power generator 5 is AC2, AC1, and AC3, and terminates the second process shown in FIG. 5.

In Step S24, the determination unit 13 determines whether or not the signal DC1 has risen during the period from the time point 1/3T before to the time point 2/3T before with respect to the timing at which the modulated sensor signal has risen. Then, the process moves to Step S25 if it is determined to have risen, and to Step S27 if it is not determined to have risen.

In Step S25, the determination unit 13 determines whether or not the signal DC3 has risen during the period from the time point 2/3T before to the time point 3/3T before with respect to the timing at which the modulated sensor signal has risen. Then, the process moves to Step S26 if it is determined to have risen, and to Step S27 if it is not determined to have risen.

In Step S26, the determination unit 13 determines that the phase sequence of the power generator 5 is AC2, AC3, and AC1, and terminates the second process shown in FIG. 5.

In Step S27, similarly to Steps S9 and S17 described above, the determination unit 13 performs error handling, and terminates the second process shown in FIG. 5.

Figure 6:
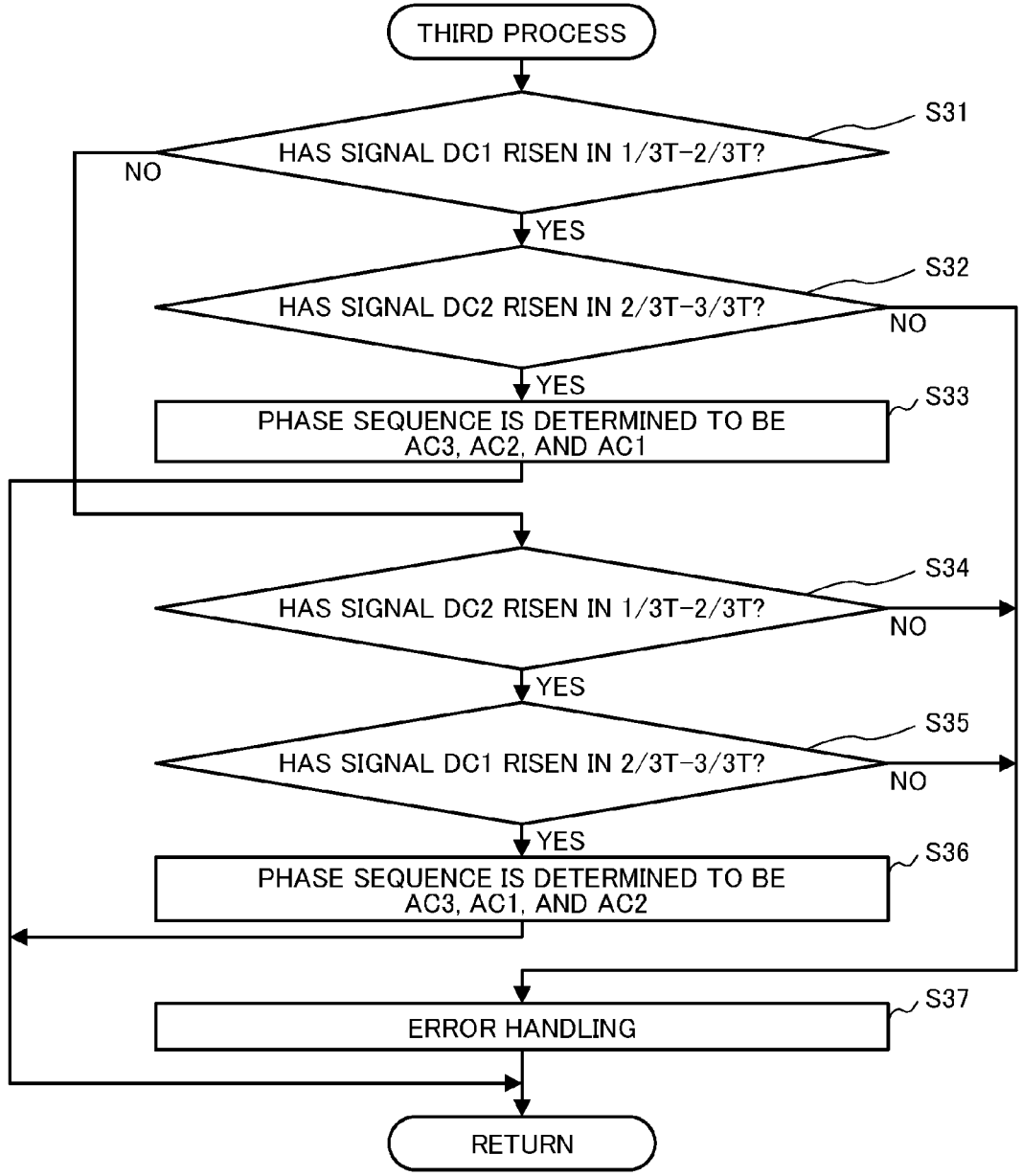
FIG. 6 is a flowchart showing the operation of the determination unit.

FIG. 6 is a flowchart of the third process performed by the determination unit 13.

In Step S31, the determination unit 13 determines whether or not the signal DC1 has risen during the period from the time point 1/3T before to the time point 2/3T before with respect to the timing at which the modulated sensor signal has risen. Then, the process moves to Step S32 if it is determined to have risen, and to Step S34 if it is not determined to have risen.

In Step S32, the determination unit 13 determines whether or not the signal DC2 has risen during the period from the time point 2/3T before to the time point 3/3T before with respect to the timing at which the modulated sensor signal has risen. Then, the process moves to Step S33 if it is determined to have risen, and to Step S37 if it is not determined to have risen.

In Step S33, the determination unit 13 determines that the phase sequence of the power generator 5 is AC3, AC2, and AC1, and terminates the third process shown in FIG. 6.

In Step S34, the determination unit 13 determines whether or not the signal DC2 has risen during the period from the time point 1/3T before to the time point 2/3T before with respect to the timing at which the modulated sensor signal has risen. Then, the process moves to Step S35 if it is determined to have risen, and to Step S37 if it is not determined to have risen.

In Step S35, the determination unit 13 determines whether or not the signal DC1 has risen during the period from the time point 2/3T before to the time point 3/3T before with respect to the timing at which the modulated sensor signal has risen. Then, the process moves to Step S36 if it is determined to have risen, and to Step S37 if it is not determined to have risen.

In Step S36, the determination unit 13 determines that the phase sequence of the power generator 5 is AC3, AC1, and AC2, and terminates the third process shown in FIG. 6.

In Step S37, similarly to Steps Step S9, S17, and S27 described above, the determination unit 13 performs error handling, and terminates the third process shown in FIG. 6.

The battery charger AA described above provides the following effects.

According to the battery charger AA, the determination unit 13 divides the sensor cycle T into three, which is equal to the number of the phases of the power generator 5, and determines a signal that rises during each of the divided periods out of the signals DC1-DC3 one by one, and thereby determines the timing at which the voltage inputted from each of the input terminals IN1-IN3 of the power generation control device 100 becomes no lower than the predetermined threshold voltage. Here, the phases AC1-AC3 of the power generator 5 respectively connected to the input terminals IN1-IN3 of the power generation control device 100. Therefore, by determining the timing at which the voltage inputted from each of the input terminals IN1-IN3 of the power generation control device 100 becomes no lower than the threshold voltage as described above, it is possible to determine the phase sequence of the phases AC1-AC3 of the power generator 5.

Further, when determining the phase sequence of the phases AC1-AC3 of the power generator 5, the battery charger AA has the determination unit 13 determine the timing at which each of the signals DC1-DC3 rises. Here, if the power generator 5 rotates inversely, the timing at which each of the signals DC1-DC3 rises are also inverted, as compared to a case in which the power generator 5 rotates normally. Accordingly, when the phase sequence of the phases AC1-AC3 of the power generator 5 is previously known, it is possible to determine whether the power generator 5 rotates normally or inversely based on the result of determination by the determination unit 13.

Moreover, the battery charger AA has the output-supply control unit 14 control the switching elements Q1-Q3 according to the result of determination by the determination unit 13. Accordingly, even if the phases AC1-AC3 of the power generator 5 are discretionally connected respectively with the input terminals IN1-IN3 of the power generation control device 100, it is possible to supply electric power to the battery 6 appropriately by controlling the switching elements Q1-Q3 according to the connection.

Second Embodiment

Hereinafter, a battery charger BB according to a second embodiment of the present invention will be described. The battery charger BB is different from the battery charger AA according to the first embodiment of the present invention illustrated in FIG. 1 in that there is provided a control circuit 1A in place of the control circuit 1. Here, components of the battery charger BB that are the same as those of the battery charger AA are denoted by the same reference numerals, and descriptions for these components shall be omitted.

The control circuit 1A is different from the control circuit 1 in that there is provided a determination unit 13A in place of the determination unit 13. Similarly to the determination unit 13, the determination unit 13A determines a phase sequence of the phases AC1-AC3 of the power generator 5. A difference is that the determination unit 13A performs a phase sequence determination process shown in FIG. 8 when determining the phase sequence of the phases AC1-AC3 of the power generator 5, while the determination unit 13 performs the phase sequence determination process shown in FIG. 3.

Figure 8:
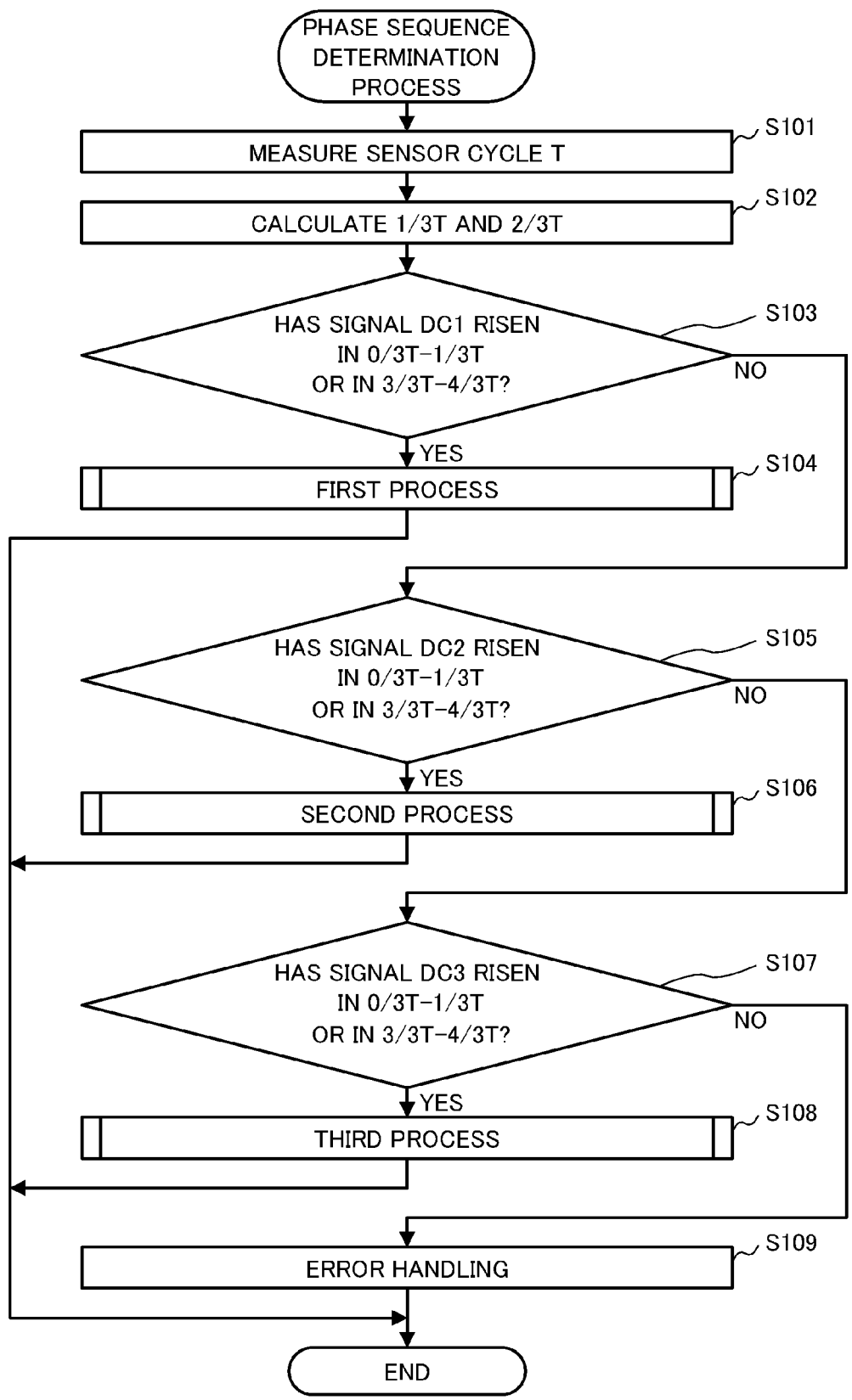
FIG. 8 is a flowchart showing an operation of a determination unit provided for a battery charger according to a second embodiment of the present invention.

FIG. 8 is a flowchart of the phase sequence determination process performed by the determination unit 13A. Here, FIG. 9 is referred as needed in order to describe the phase sequence determination process shown in FIG. 8.

Figure 9:
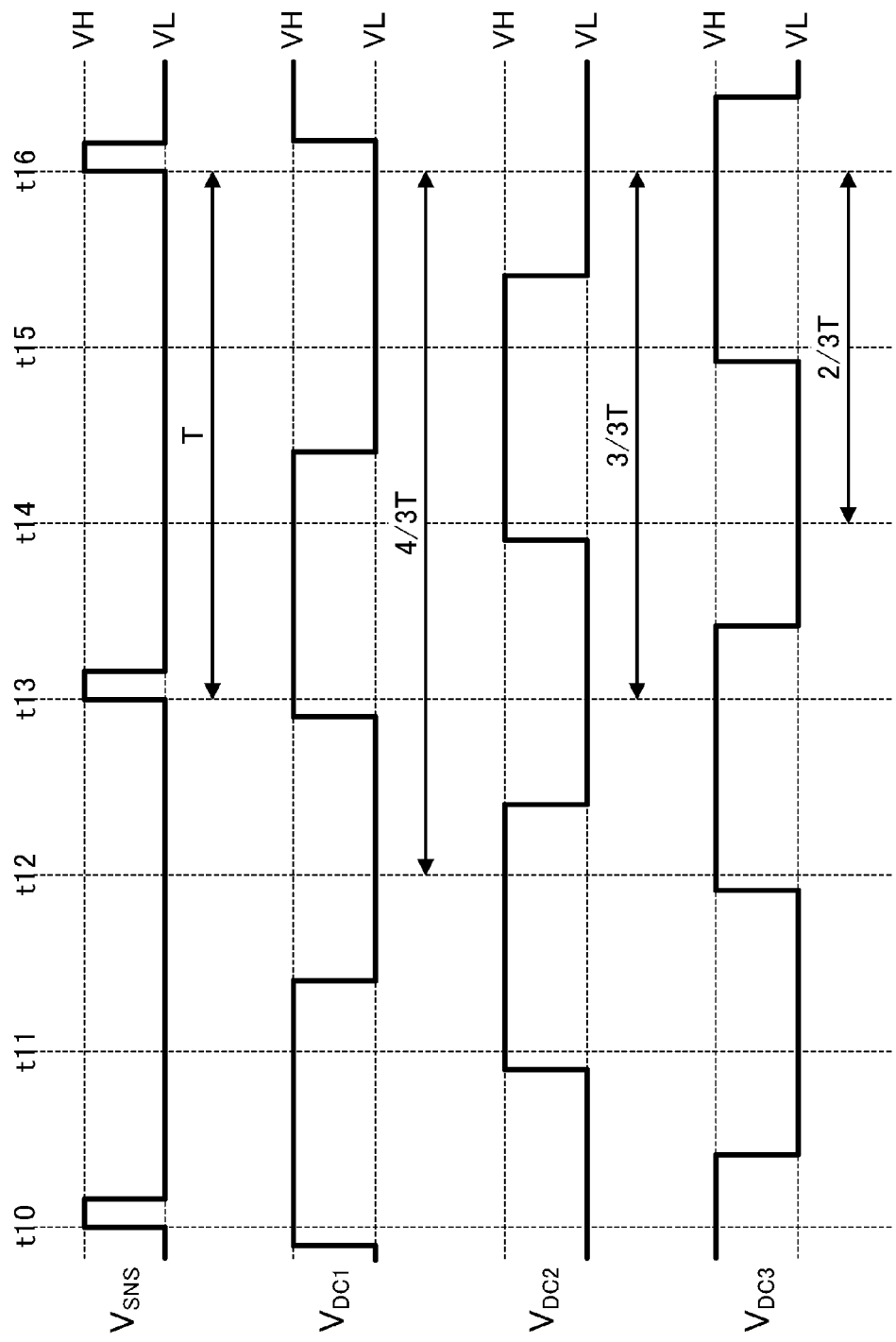
FIG. 9 is a diagram for illustrating the operation of the determination unit.

Referring to FIG. 9, similarly to FIG. 7, the phase sequence of the power generator 5 is AC1, AC2, and AC3. In FIG. 9, however, the signal DC1 rises immediately after a time point t16 as the reference, while the signal DC1 rises immediately before the time point t6 as the reference in FIG. 7. Possible causes of the delayed rise of the signal DC1 include a sudden change of the sensor cycle T due to a change in the operation of the power generator 5, and an occurrence of a measurement error of the voltage $V_{SNS}$ or the voltage $V_{DC1}$.

Referring back to FIG. 8, in Steps S101, S102, S104, S106, S108, and S109, the determination unit 13A performs the same processing as that performed by the determination unit 13 in Steps S1, S2, S4, S6, S8, and S9 in FIG. 3, respectively.

In Step S103, the determination unit 13A determines whether or not the signal DC1 has risen during the period from the time point 0/3T before to the time point 1/3T before, or during a period from a time point 3/3T before to a time point 4/3T before, with respect to the timing at which the modulated sensor signal has risen. Then, the process moves to Step S104 if it is determined to have risen, and to Step S105 if it is not determined to have risen.

It should be noted that in FIG. 9, the time point t16 that is timing at which the modulated sensor signal has risen is taken as the reference. Further, none of the signals DC1-DC3 has risen during a period from the time point t16 which is 0/3T before the time point t16 to a time point t15 which is 1/3T before the time point t16. However, the signal DC1 has risen during a period from a time point t13 which is 3/3T before the time point t16 to a time point t12 which is 4/3T before the time point t16. Accordingly, in a state illustrated in FIG. 9, it is determined that the signal has risen in Step S103.

Further, in Step S105, the determination unit 13A determines whether or not the signal DC2 has risen during the period from the time point 0/3T before to the time point 1/3T before, or during the period from the time point 3/3T before to the time point 4/3T before, with respect to the timing at which the modulated sensor signal has risen. Then, the process moves to Step S106 if it is determined to have risen, and to Step S107 if it is not determined to have risen.

Further, in Step S107, the determination unit 13A determines whether or not the signal DC3 has risen during the period from the time point 0/3T before to the time point 1/3T before, or during the period from the time point 3/3T before to the time point 4/3T before, with respect to the timing at which the modulated sensor signal has risen. Then, the process moves to Step S108 if it is determined to have risen, and to Step S109 if it is not determined to have risen.

The battery charger BB described above provides the following effects, in addition to the effects provided by the battery charger AA according to the first embodiment of the present invention.

There is conceivable a case in which the rise of the signals DC1-DC3 delays as described regarding the rise of the signal DC1 with reference to FIG. 7 and FIG. 9. In this case, it is likely that none of the signals DC1-DC3 rises during the period from the time point 0/3T before to the time point 1/3T before with respect to the timing at which the modulated sensor signal has risen. In this case, the battery charger BB is able to determine the phase sequence of the power generator 5, while the battery charger AA is not able to determine the phase sequence of the power generator 5.

The present invention is not limited to the above embodiments, and various modifications and alterations may be made without departing from the spirit of the invention.

For example, in the above embodiments, the battery 6 is employed as a load to which electric power is supplied from the power generator 5, but the present invention not limited to this example.

Further, in the above embodiments, the power generator 5 has, but not limited to, the three phases, and may have two phases or four phases, for example.

Moreover, in the above embodiments, the determination unit 13 and the determination unit 13A divide the sensor cycle T by the number equal to the number of the phases of the power generator 5, but the present invention not limited to this example. For example, when the power generator 5 has p phases (where p is an integer satisfying p≥2), the sensor cycle T may be divided by q. Here, q is a number satisfying q≥p, and may be an integer or a decimal number.

Furthermore, in the above embodiments, the drive circuit 30 performs, but not limited to, PWM control of the switching elements Q1-Q3, and may perform phase control.

Further, in the above embodiments, the determination unit 13 and the determination unit 13A determine the phase sequence of the power generator 5 based on whether or not each of the signals DC1-DC3 has risen, but the present invention not limited to this example. For example, the phase sequence may be determined based on whether or not each of the signals DC1-DC3 has fallen. In addition, it is possible to determine the phase sequence based on a combination of both the rise and fall of each of the signals DC1-DC3.

REFERENCE MARKS IN THE DRAWINGS 1, 1A: Control Circuit
5: Power Generator
6: Battery
7: Detection Circuit
8: Fuse
11: Frequency Control Unit
12: Cycle Obtaining Unit
13, 13A: Determination Unit
14: Output-Supply Control Unit
20: Zero Cross Signal Generating Circuit
30: Drive Circuit
100: Power Generation Control Device
Q1-Q3: Switching Element
AA, BB: Battery Charger
AC1-AC3: Phase

The invention claimed is:

1. A control circuit for determining a phase sequence of an n-phase alternating-current generator (having n phases and where n is an integer satisfying $n \geq 2$), the phase sequence relating to an order of output voltages respectively outputted from the phases, the control circuit comprising:
a determination unit configured to determine the phase sequence of the n-phase alternating-current generator by detecting timing at which an output voltage outputted from each of the n phases either exceeds or falls below a predetermined threshold value and
a cycle obtaining unit configured to obtain a cycle of the output voltages respectively outputted from the phases of the n-phase alternating-current generator, wherein
assuming that time resulting from division of the cycle obtained by the cycle obtaining unit by the n is specific time,
the determination unit performs a phase determination procedure for obtaining one phase, out of the n phases, in which the output voltage has become no lower than the predetermined threshold voltage during a period from a time point that is x times of the specific time before predetermined reference timing (where x is an integer satisfying $0 \leq x \leq n-1$) to a time point that is (x+1) times of the specific time before the reference timing.

2. The control circuit according to claim 1, wherein the determination unit performs the phase determination procedure by substituting i+n for the x when failing to obtain the one phase through the phase determination procedure by substituting i for the x (where i is an integer satisfying $0 \leq i \leq n$).

3. The control circuit according to claim 1, wherein the reference timing is timing synchronous with the n-phase alternating-current generator.

4. The control circuit according to claim 1, further comprising: a frequency control unit configured to have a frequency of a reference signal indicating the reference timing match with a frequency of the output voltage of one of the n phases.

5. A power generation device, comprising:
the control circuit as defined in claim 1, wherein
electric power outputted from the n-phase alternating-current generator is supplied to a load.

6. A control circuit for determining a phase sequence of an n-phase alternating-current generator (having n phases and where n is an integer satisfying $n \geq 2$), the phase sequence relating to an order of output voltages respectively outputted from the phases, the control circuit comprising:
a determination unit configured to determine the phase sequence of the n-phase alternating-current generator by detecting timing at which an output voltage outputted from each of the n phases either exceeds or falls below a predetermined threshold value; and
a cycle obtaining unit configured to obtain a cycle of the output voltages respectively outputted from the phases of the n-phase alternating-current generator, wherein
assuming that time resulting from division of the cycle obtained by the cycle obtaining unit by the n is specific time,
the determination unit performs a phase determination procedure for obtaining one phase, out of the n phases, in which the output voltage has become no higher than the predetermined threshold voltage during a period from a time point that is x times of the specific time before predetermined reference timing (where x is an integer satisfying $0 \leq x \leq n-1$) to a time point that is (x+1) times of the specific time before the reference timing.

7. A control circuit for determining a phase sequence of an n-phase alternating-current generator (having n phases and where n is an integer satisfying $n \geq 2$), the phase sequence relating to an order of output voltages respectively outputted from the phases, the control circuit comprising:
a determination unit configured to determine the phase sequence of the n-phase alternating-current generator by detecting timing at which an output voltage outputted from each of the n phases either exceeds or falls below a predetermined threshold value; and
a cycle obtaining unit configured to obtain a cycle of the output voltages respectively outputted from the phases of the n-phase alternating-current generator, wherein
assuming that time resulting from division of the cycle obtained by the cycle obtaining unit by a number two-fold of the n is specific time,
the determination unit performs a phase determination procedure for obtaining, out of the n phases, one phase in which the output voltage has become no lower than the predetermined threshold voltage and one phase in which the output voltage has become no higher than the threshold voltage one by one during a period from a time point that is x times of the specific time before predetermined reference timing (where x is an integer satisfying $0 \leq x \leq 2n-1$) to a time point that is (x+1) times of the specific time before the reference timing.

8. The control circuit according to claim 7, wherein the determination unit performs the phase determination procedure by substituting i+n for the x when failing to obtain at least one of the one phase in which the output voltage has become no lower than the threshold voltage and the one phase in which the output voltage has become no higher than the threshold voltage through the phase determination procedure by substituting i for the x (where i is an integer satisfying $0 \leq i \leq n$).

* * * * *